(12) United States Patent
Yang et al.

(10) Patent No.: US 9,363,884 B2
(45) Date of Patent: Jun. 7, 2016

(54) COMPOSITE MATERIAL AND ELECTRONIC DEVICE

(71) Applicant: Huawei Device Co., Ltd., Shenzhen (CN)

(72) Inventors: Jun Yang, Shenzhen (CN); Liechun Zhou, Shenzhen (CN); Hualin Li, Shanghai (CN); Xijie Wu, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 288 days.

(21) Appl. No.: 14/072,199

(22) Filed: Nov. 5, 2013

(65) Prior Publication Data

US 2014/0055957 A1   Feb. 27, 2014

Related U.S. Application Data

(63) Continuation of application No. PCT/CN2011/073751, filed on May 6, 2011.

(51) Int. Cl.
*H05K 7/20* (2006.01)
*H05K 1/02* (2006.01)
(Continued)

(52) U.S. Cl.
CPC ............ *H05K 1/0204* (2013.01); *H01L 23/552* (2013.01); *H01L 24/18* (2013.01);
(Continued)

(58) Field of Classification Search
CPC ..... H05K 7/20; H05K 1/0218; H05K 9/0024; H05K 9/00; H05K 9/0088; H01L 23/552; H01L 2924/3025; G06F 1/20
USPC .............. 361/679.46–679.54, 700–712, 361/715–721, 800, 812, 816, 818; 257/706, 257/707, 713, 718, 719, 723, 724, 698; 174/350, 351, 377, 378, 254, 547; 165/80.2, 104.33, 185
See application file for complete search history.

(56) References Cited

U.S. PATENT DOCUMENTS 3,756,399 A * 9/1973 Cosier .................. B65D 75/305
174/547

(Continued)

FOREIGN PATENT DOCUMENTS

| CN | 201263276 Y | 6/2009 |
| CN | 201329681 Y | 10/2009 |

(Continued)

OTHER PUBLICATIONS

Foreign Communication From a Counterpart Application, European Application No. 11777176.6, Extended European Search Report dated Mar. 12, 2015, 5 pages.

(Continued)

*Primary Examiner* — Michail V Datskovskiy
(74) *Attorney, Agent, or Firm* — Conley Rose, P.C.; Grant Rodolph; Nicholas K. Beaulieu

(57) ABSTRACT

A composite material and an electronic device are disclosed in embodiments of the present invention, relating to the field of electronic assembly technologies. The technical problem of the existing electronic device with an excessively complicated internal structure is solved. The composite material includes an electrically and thermally conductive layer, a viscose glue layer, and an insulating layer, where the electrically and thermally conductive layer and the insulating layer are pasted at two sides of the viscose glue layer; the viscose glue layer is electrically conductive. The electronic device includes a circuit board and the composite material. Gaps are formed at the insulating layer in positions corresponding to electronic components and/or shielding frames, with the viscose glue layer exposed, the composite material is pasted onto the electronic components and/or the shielding frames via the viscose glue layer. The present invention is applied to simplify the structure of an electronic device.

8 Claims, 4 Drawing Sheets

(51) Int. Cl.
  *H05K 9/00* (2006.01)
  *H01L 23/552* (2006.01)
  *H01L 23/00* (2006.01)

(52) U.S. Cl.
  CPC ......... *H05K 1/0216* (2013.01); *H05K 7/20472* (2013.01); *H05K 9/003* (2013.01); *Y10T 428/264* (2015.01); *Y10T 428/30* (2015.01); *Y10T 428/31504* (2015.04); *Y10T 428/31678* (2015.04)

(56) References Cited

U.S. PATENT DOCUMENTS

| | | | | |
|---|---|---|---|---|
| 4,965,408 | A * | 10/1990 | Chapman | B32B 15/08 174/363 |
| 5,166,864 | A * | 11/1992 | Chitwood | H05K 1/0218 174/351 |
| 5,394,304 | A * | 2/1995 | Jones | B65B 53/02 174/256 |
| 5,461,545 | A * | 10/1995 | Leroy | H05K 3/284 174/17.05 |
| 5,557,064 | A * | 9/1996 | Isern-Flecha | H05K 3/284 174/378 |
| 5,639,989 | A * | 6/1997 | Higgins, III | H01L 23/552 174/386 |
| 6,046,907 | A | 4/2000 | Yamaguchi | |
| 6,492,194 | B1 * | 12/2002 | Bureau | H01L 21/56 257/E21.502 |
| 6,744,640 | B2 * | 6/2004 | Reis | H01L 23/552 174/383 |
| 6,768,654 | B2 * | 7/2004 | Arnold | B29C 45/14811 174/394 |
| 6,992,400 | B2 * | 1/2006 | Tikka | H01L 23/3135 257/787 |
| 7,214,889 | B2 * | 5/2007 | Mazurkiewicz | H01L 23/552 174/377 |
| 7,445,968 | B2 * | 11/2008 | Harrison | H01L 23/3677 257/660 |
| 7,518,880 | B1 * | 4/2009 | Ziberna | H05K 9/0084 174/350 |
| 7,752,751 | B2 * | 7/2010 | Kapusta | C23C 14/046 29/846 |
| 8,008,753 | B1 * | 8/2011 | Bolognia | H01L 23/552 257/659 |
| 8,493,749 | B2 * | 7/2013 | Myers | H05K 3/284 361/818 |
| 8,495,815 | B2 * | 7/2013 | Izawa | H05K 9/0024 156/272.2 |
| 9,179,538 | B2 * | 11/2015 | Foster | H05K 1/0218 |
| 2006/0152913 | A1 * | 7/2006 | Richey | H05K 1/0218 361/818 |
| 2009/0207578 | A1 | 8/2009 | Ligtenberg | |
| 2012/0261181 | A1 * | 10/2012 | Izawa | H05K 9/0024 174/378 |

FOREIGN PATENT DOCUMENTS

| | | |
|---|---|---|
| CN | 101896058 A | 11/2010 |
| CN | 101966768 A | 2/2011 |
| EP | 2254401 A2 | 11/2010 |
| JP | 5304387 A | 11/1993 |
| JP | 10126081 A | 5/1998 |
| JP | 2000106495 A | 4/2000 |
| JP | 2010123839 A | 6/2010 |
| JP | 2011018873 A | 1/2011 |
| WO | 2004037447 A1 | 5/2004 |

OTHER PUBLICATIONS

Partial English Translation and Abstract of Japanese Patent Application No. JP2010123839A, Jan. 23, 2015, 22 pages.
Partial English Translation and Abstract of Japanese Patent Application No. JP2011018873A, Jan. 23, 2015, 26 pages.
Foreign Communication From a Counterpart Application, Japanese Application No. 2014-508670, Japanese Office Action dated Dec. 9, 2014, 2 pages.
Foreign Communication From a Counterpart Application, Japanese Application No. 2014-508670, English Translation of Japanese Office Action dated Dec. 9, 2014, 3 pages.
Foreign Communication From a Counterpart Application, Chinese Application No. 201180000327.3, Chinese Office Action dated Jul. 2, 2012, 7 pages.
Foreign Communication From a Counterpart Application, PCT Application No. PCT/CN2011/073751, International Search Report dated Feb. 16, 2012, 8 pages.
Foreign Communication From a Counterpart Application, PCT Application No. PCT/CN2011/073751, Written Opinion dated Feb. 16, 2012, 5 pages.

* cited by examiner

COMPOSITE MATERIAL AND ELECTRONIC DEVICE

CROSS-REFERENCE TO RELATED APPLICATION

This application is a continuation of International Application No. PCT/CN2011/073751, filed on May 6, 2011, which is hereby incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to the field of electronic assembly technologies, and in particular, relates to a composite material and an electronic device.

BACKGROUND

With the continuous development of electronic technologies, the integration of electronic components is also continuously improved, and the density of heat generated by these components during work takes on a clear ascending trend. On the other hand, due to the increase of electronic devices integrating wireless communication modules, products have increasingly higher requirements on the electromagnetic shielding performance. Therefore, in the electronic devices such as a mobile phone and a digital music player, many components have double requirements on heat dissipation and electromagnetic shielding.

As shown in FIG. 1, an existing electronic device usually adopts the solution of assembling heat conducting pads 6 and shielding covers 7. Electronic components 2 are mounted on a circuit board 1, heat generated by the electronic components 2 is transferred to a housing 8 through a heat conducting material 5, and the heat conducting pads 6 are filled between the electronic components 2, the heat conducting material 5, and the housing 8, thereby implementing heat dissipation. The heat conducting material 5 mainly functions to uniformly dissipate heat, so as to prevent an excessively high temperature on local parts of the electronic device; also, in some electronic devices, the heat conducting material 5 is not provided, and the heat generated by the electronic components 2 is transferred to the housing 8 through the heat conducting pads 6 directly. In addition, the shielding covers 7 connected to the shielding frames 3 are used to implement electromagnetic shielding of the electronic components 2.

The inventor of the present invention finds during the implementation of the present invention that, the prior art has at least the following problems: The existing electronic device uses the heat conducting pads and the shielding covers to respectively implement heat dissipation and electromagnetic shielding, thereby causing an excessively complicated internal structure of the electronic device.

SUMMARY

Embodiments of the present invention provide a composite material and an electronic device, which implement heat dissipation and electromagnetic shielding with a simpler structure.

In order to achieve the above objective, the embodiments of the present invention adopt the following technical solutions.

The composite material includes an electrically and thermally conductive layer, a viscose glue layer, and an insulating layer which are mutually attached, where the electrically and thermally conductive layer and the insulating layer are respectively attached to two sides of the viscose glue layer; and the viscose glue layer is electrically conductive.

The electronic device includes a circuit board and a composite material; where electronic components and shielding frames are arranged on the circuit board, and the composite material includes an electrically and thermally conductive layer, a viscose glue layer, and an insulating layer which are mutually attached, where the electrically and thermally conductive layer and the insulating layer are respectively attached to two sides of the viscose glue layer, and the viscose glue layer is electrically conductive; where gaps are formed at the insulating layer in the positions corresponding to the electronic components and/or the shielding frames, with the viscose glue layer exposed, and the composite material is pasted onto the electronic components and/or the shielding frames via the viscose glue layer.

As compared with the prior art, the technical solutions provided by the present invention have the following advantages: The composite material is pasted onto the electronic components via the viscose glue layer, so that the electrically and thermally conductive layer can contact the electronic components more firmly; and the viscose glue layer can further fill the gap between the contacting surfaces thereof, thereby reducing thermal resistance and implementing heat dissipation. On the other hand, the composite material is pasted onto the shielding frames via the viscose glue layer, and the viscose glue layer is also electrically conductive, so that a more stable electrical connection can be formed between the electrically and thermally conductive layer and the shielding frames, thereby implementing electromagnetic shielding.

According to the technical solutions provided by the present invention, only one composite material is needed to implement heat dissipation and electromagnetic shielding at the same time, thereby solving the technical problem of the existing electronic device with an excessively complicated internal structure caused by using the heat conducting pads and the shielding covers to respectively implement heat dissipation and electromagnetic shielding.

BRIEF DESCRIPTION OF THE DRAWINGS

To describe the technical solutions in the embodiments of the present invention or in the prior art more clearly, the following briefly introduces the accompanying drawings required for describing the embodiments or the prior art. Apparently, the accompanying drawings in the following descriptions show merely some embodiments of the present invention, and persons of ordinary skill in the art may still derive other drawings from the accompanying drawings without creative efforts.

DETAILED DESCRIPTION

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

The embodiments of the present invention provide a composite material and an electronic device.

Embodiment 1

Figure 1:
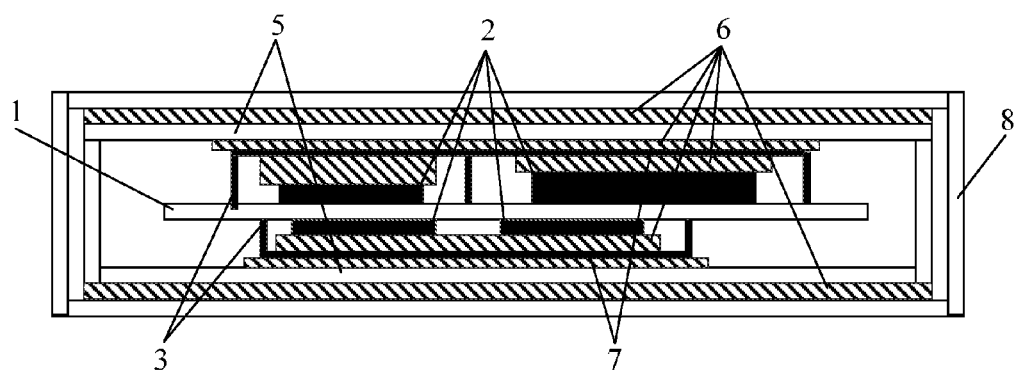
FIG. 1 is a schematic diagram of an internal structure of an existing electronic device.
Figure 2:
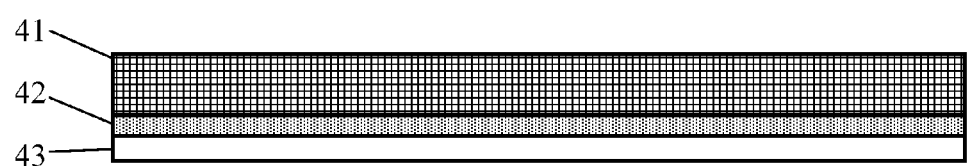
FIG. 2 is a schematic structural diagram of a composite material according to Embodiment 1 of the present invention.

As shown in FIG. 2, the composite material provided by the embodiment of the present invention includes an electrically and thermally conductive layer 41, a viscose glue layer 42, and an insulating layer 43 which are mutually attached. The electrically and thermally conductive layer 41 and the insulating layer 43 are respectively attached to two sides of the viscose glue layer 42. The viscose glue layer 42 is electrically conductive. According to an exemplary solution, the composite material is flexible, and as seen from the appearance, it is similar to paper, being light, thin, soft, and slightly stretchable and extendable. The electrically and thermally conductive layer 41 is made of one or more of the materials such as copper, graphite, aluminum, and porcelain, and is formed in the form of a thin layer with a thermal conductivity coefficient being above 50 Watts/meter·Kelvin (W/m·K). If graphite is adopted, due to its special molecular structure, the thermal conductivity coefficient is relevant to directions. To be specific, the thermal conductivity coefficient in the planar direction is above 50 W/m·K, and the thermal conductivity coefficient in the normal direction is above 5 W/m·K. The viscose glue layer 42 is exemplarily in a monolayer structure or a multilayer structure formed by one or more of acrylic adhesive and polyester film.

Figure 3:
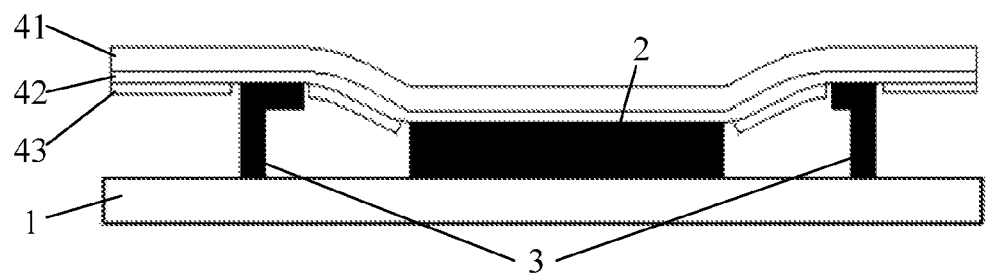
FIG. 3 is a schematic diagram of an implementation of the composite material according to Embodiment 1 of the present invention.

As shown in FIG. 3, gaps are formed at the insulating layer 43 in the positions corresponding to a electronic component 2 and/or a shielding frame 3, with the viscose glue layer 42 exposed. The composite material is pasted onto the electronic components 2 via the viscose glue layer 42, so that the electrically and thermally conductive layer 41 can contact the electronic component 2 more firmly. Although the thermal conductivity coefficient of the viscose glue layer 42 is lower than that of the electrically and thermally conductive layer 41, the viscose glue layer 42 can further fill a seam between the contacting surfaces of the composite material and the electronic component 2, thereby reducing thermal resistance and implementing heat dissipation. On the other hand, the composite material is pasted onto the shielding frame 3 via the viscose glue layer 42, and the viscose glue layer 42 is also electrically conductive, so that a more stable electrical connection can be formed between the electrically and thermally conductive layer 41 and the shielding frame 3, thereby implementing electromagnetic shielding.

The circuit board 1 may further include some exposed pins in addition to the electronic component 2 and the shielding frame 3, and the composite material only needs to form an electrical connection with the shielding frame 3. Because gaps are only formed at the insulating layer 43 in the positions corresponding to the electronic component 2 and/or shielding frame 3, other portions of the composite material are still covered by the insulating layer 43, and no improper electrical connection is formed between the composite material and the pins, so that the situations such as short circuit are not caused.

Therefore, only one composite material of the present invention is needed to implement heat dissipation and electromagnetic shielding at the same time, thereby solving the technical problem of the existing electronic device with an excessively complicated internal structure caused by using the heat conducting pads and the shielding covers to respectively implement heat dissipation and electromagnetic shielding.

Embodiment 2

Figure 4:
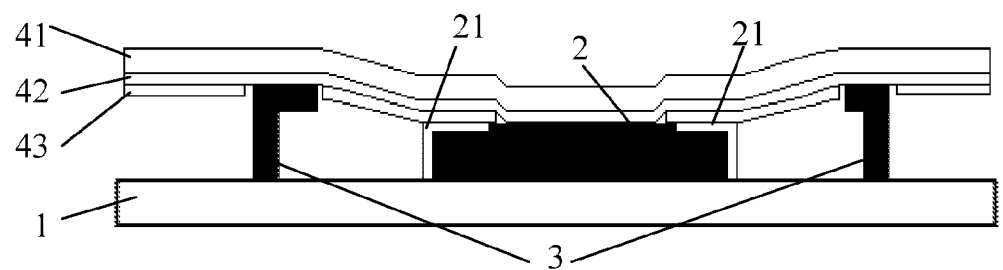
FIG. 4 is a schematic diagram of an implementation of a composite material according to Embodiment 2 of the present invention.

This embodiment is basically the same as Embodiment 1, and the difference is as follows: In this embodiment, as shown in FIG. 4, the electronic components 2 have some pins 21 exposed. When the gaps are formed at the insulating layer 43, the insulating layer 43 needs to be reserved in only corresponding positions, and therefore, after the composite material is pasted onto the electronic components 2 via the viscose glue layer 42, the insulating layer 43 can still prevent the electrical connection between the pins 21 on the electronic components 2 and the electrically and thermally conductive layer 41.

In an embodiment of the present invention, the thickness of the electrically and thermally conductive layer 41 is less than or equal to 2 millimeters (mm). The electrically and thermally conductive layer of only 2 mm thick can implement good electrical conductivity and thermal conductivity. Meanwhile, in order to reduce occupied space as much as possible, the thickness of the electrically and thermally conductive layer 41 may be further reduced.

In an embodiment of the present invention, the thickness of the viscose glue layer 42 is less than or equal to 0.2 mm. The viscose glue layer 42 mainly functions to fix elements and reduce thermal resistance, but the resistivity thereof is large, so the thickness thereof should be reduced as much as possible.

In an embodiment of the present invention, the thickness of the insulating layer 43 is less than or equal to 0.5 mm. Because the gaps need to be formed at the insulating layer 43 during use, and the insulation effect should be ensured at the same time, the thickness of the insulating layer 43 is required to be proper.

Embodiment 3

Figure 5:
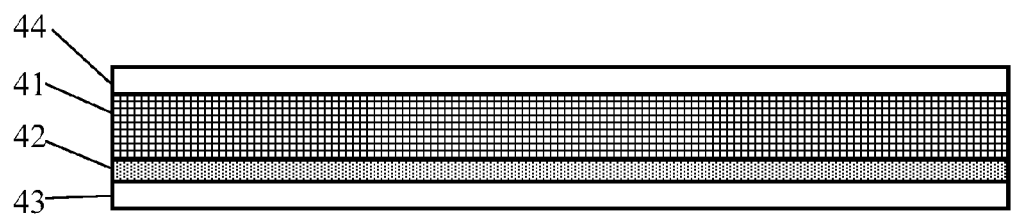
FIG. 5 is a schematic structural diagram of a composite material according to Embodiment 3 of the present invention.

This embodiment is basically the same as Embodiment 2, and the difference is as follows: As shown in FIG. 5, in this embodiment, an insulating layer 44 is also provided on one side of the electrically and thermally conductive layer 41 opposite to the viscose glue layer 42. In Embodiment 2, one side of the composite material is pasted onto the electronic component and/or the shielding frame, and the electrically and thermally conductive layer 41 is exposed out of the other side. In order to prevent other portions from forming an improper electrical connection on this side with the electrically and thermally conductive layer 41, in this embodiment, this side is covered by the insulating layer 44.

Embodiment 4

Figure 6:
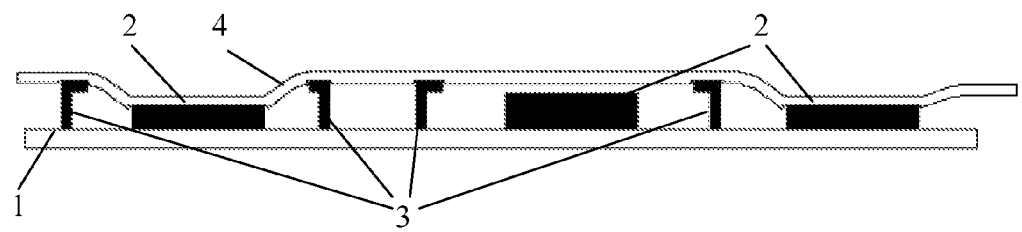
FIG. 6 is a schematic structural diagram of an electronic device according to Embodiment 4 of the present invention.

As shown in FIG. 6, an electronic device provided by this embodiment of the present invention includes a circuit board 1 and a composite material 4. Electronic component 2 and shielding frame 3 are provided on the circuit board 1. The composite material 4 includes an electrically and thermally conductive layer, a viscose glue layer, and an insulating layer which are mutually attached. The electrically and thermally conductive layer and the insulating layer are respectively attached to two sides of the viscose glue layer. The viscose glue layer is electrically conductive. Gaps are formed at the insulating layer in position corresponding to the electronic component 2 and/or the shielding frame 3, with the viscose glue layer exposed, and the composite material 4 is pasted onto the electronic component 2 and/or the shielding frame 3 via the viscose glue layer.

Figure 8:
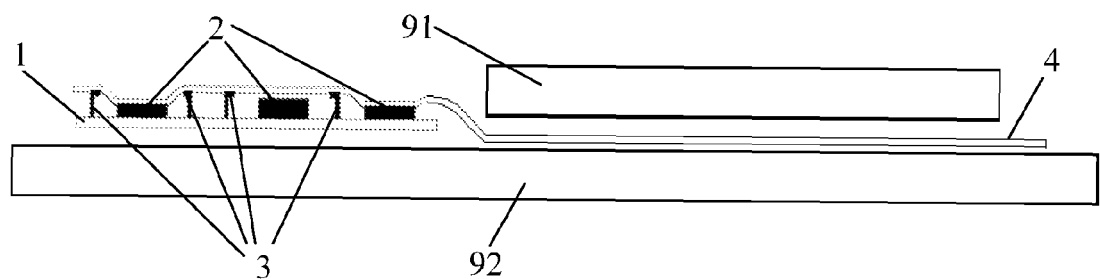
FIG. 8 is a schematic structural diagram of an electronic device according to Embodiment 6 of the present invention.

Because the composite material 4 is light, thin, soft, flexible, and slightly stretchable and extendable, one composite material 4 can implement heat dissipation and/or electromagnetic shielding of multiple electronic components 2. Some electronic components 2 require both heat dissipation and electromagnetic shielding, so the composite material 4 needs to be pasted onto the electronic components 2 and the shielding frames 3 around the electronic components 2 (as shown in FIG. 8, the electronic components 2 on the left); some electronic components 2 only require electromagnetic shielding instead of heat dissipation, so the composite material 4 only needs to be pasted onto the shielding frames 3 around the electronic components 2 (as shown in FIG. 8, the electronic components 2 in the middle); and some electronic components 2 only require heat dissipation instead of electromagnetic shielding, so the composite material 4 only needs to be pasted onto the electronic components 2 (as shown in FIG. 8, the electronic components 2 on the right).

This embodiment of the present invention has the same technical features as the composite material provided in Embodiment 1 of the present invention, thereby generating the same technical effect and solving the same technical problem.

Embodiment 5

Figure 7:
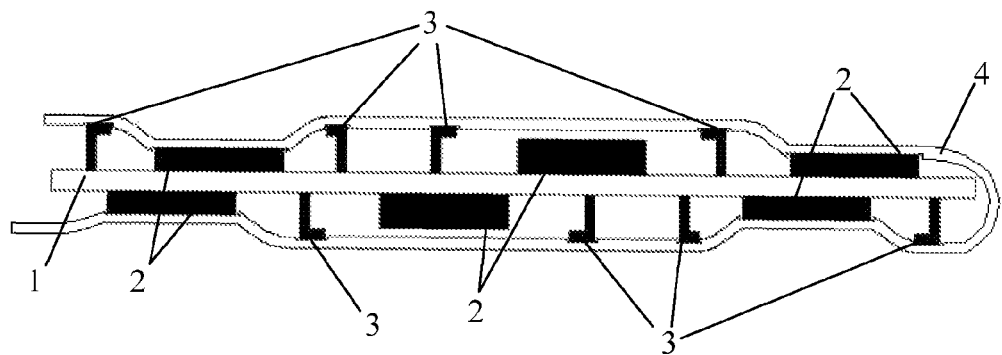
FIG. 7 is a schematic structural diagram of an electronic device according to Embodiment 5 of the present invention.

This embodiment is basically the same as Embodiment 4, and the difference is as follows: As shown in FIG. 7, in this embodiment, the electronic components 2 and the shielding frames 3 are arranged on two sides of the circuit board 1. The composite material 4 is pasted onto the electronic components 2 and/or the shielding frames 3 on the two sides of the circuit board 1. Moreover, the composite material 4, in one piece, is bent and wrapped on the two sides of the circuit board 1.

Because the composite material 4 is light, thin, soft, flexible, and slightly stretchable and extendable, by pasting one composite material 4 onto the electronic components 2 and/or the shielding frames 3 on the two sides of the circuit board 1, the effect of electromagnetic shielding can be improved, and the heat on the two sides of the circuit board 1 is uniformly distributed, so the heat dissipation effect is improved.

Embodiment 6

This embodiment is basically the same as Embodiment 4, and the difference is as follows: As shown in FIG. 8, in this embodiment, the composite material 4 is extended to other heat generating portions out of the circuit board 1. The composite material 4 of a larger area is used to extend to other portions, out of the circuit board 1, such as a battery 91 and a display screen 92 in a mobile phone. The composite material 4 is pasted onto the electronic components 2 and/or the shielding frames 3 on the circuit board 1, and meanwhile contacts the battery 91 and the display screen 92, so that the heat on the circuit board 1, the battery 91, and the display screen 92 is uniformly distributed, thereby achieving a better overall heat dissipation effect of the mobile phone.

Embodiment 7

This embodiment is basically the same as Embodiment 4, and the difference is as follows: In this embodiment, an insulating layer is also provided on one side of the electrically and thermally conductive layer opposite to the viscose glue layer. In Embodiment 4, one side of the composite material is pasted onto the electronic components and/or the shielding frames, and the electrically and thermally conductive layer is exposed out of the other side. In order to prevent other portions from forming an improper electrical connection on this side with the electrically and thermally conductive layer, in this embodiment, this side is also covered by the insulating layer.

The foregoing descriptions are merely specific embodiments of the present invention, but are not intended to limit the protection scope of the present invention. Any variation or replacement readily figured out by persons skilled in the art within the disclosed technical scope of the present invention shall fall within the protection scope of the present invention. Therefore, the protection scope of the present invention shall be subject to the protection scope of the claims.

What is claimed is:

1. An electronic device, comprising:
   a circuit board; and
   a composite material,
   wherein electronic components and shielding frames are provided on the circuit board,
   wherein the composite material comprises an electrically and thermally conductive layer, a viscose glue layer, and an insulating layer,
   wherein the electrically and thermally conductive layer and the insulating layer are respectively attached to two sides of the viscose glue layer,
   wherein the viscose glue layer is electrically conductive,
   wherein gaps are formed at the insulating layer to expose the viscose glue layer in positions corresponding to the electronic components when the electrical components are electrical components that require heat dissipation and are in positions corresponding to the shielding frames,
   wherein the composite material is adhered onto the electronic components via the viscose glue layer when the electrical components are electrical components that require heat dissipation, and
   wherein the composite material is adhered onto the shielding frames via the viscose glue layer when the electrical components are electrical components that require electromagnetic shielding.

2. An electronic device, comprising:
   a circuit board; and
   a composite material,
   wherein electronic components and shielding frames are provided on the circuit board.

wherein the composite material comprises an electrically and thermally conductive layer, a viscose glue layer, and an insulating layer, wherein the electrically and thermally conductive layer and the insulating layer are respectively attached to two sides of the viscose glue layer, wherein the viscose glue layer is electrically conductive, wherein gaps are formed at the insulating layer with the viscose glue layer exposed in positions corresponding to the electronic components and/or the shielding frames, wherein the composite material is adhered onto the electronic components and/or the shielding frames via the viscose glue layer, wherein the electronic components and the shielding frames are arranged on two sides of the circuit board, wherein the composite material is adhered onto the electronic components and/or the shielding frames on the two sides of the circuit board, and wherein the composite material, in one piece, is bent and wrapped on the two sides of the circuit board.

3. The electronic device according to claim 1, wherein the composite material is extended to other heat generating portions out of the circuit board.

4. The electronic device according to claim 1, wherein, in the composite material, a second insulating layer is also provided on one side of the electrically and thermally conductive layer opposite to the viscose glue layer.

5. The electronic device of claim 1, wherein the composite material has a thermal conductivity coefficient greater than 50 watts per meter kelvin (W/m·K).

6. The electronic device of claim 1, wherein the electrically and thermally conductive layer comprises at least one of copper, graphite, aluminum, and porcelain.

7. The electronic device of claim 2, wherein the composite material has a thermal conductivity coefficient greater than 50 watts per meter kelvin (W/m·K).

8. The electronic device of claim 2, wherein the electrically and thermally conductive layer comprises at least one of copper, graphite, aluminum, and porcelain.

\* \* \* \* \*